US010382078B2

(12) United States Patent
Mukherjee et al.

(10) Patent No.: US 10,382,078 B2
(45) Date of Patent: Aug. 13, 2019

(54) SELECTIVELY ACTIVATING OSCILLATION MODULES BASED ON SIGNAL STRENGTHS

(71) Applicant: TEXAS INSTRUMENTS INCORPORATED, Dallas, TX (US)

(72) Inventors: Subhashish Mukherjee, Bangalore (IN); Yogesh Darwhekar, Bangalore (IN); Nagaraj V. Dixit, Bangalore (IN); Raghu Ganesan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/486,909

(22) Filed: Apr. 13, 2017

(65) Prior Publication Data

US 2017/0302310 A1     Oct. 19, 2017

(30) Foreign Application Priority Data

Apr. 13, 2016   (IN) .............................. 201641012995

(51) Int. Cl.
| | |
|---|---|
| *H04B 1/10* | (2006.01) |
| *H04B 1/16* | (2006.01) |
| *H04B 17/318* | (2015.01) |
| *H03L 7/099* | (2006.01) |
| *H03J 7/00* | (2006.01) |
| *H03L 7/087* | (2006.01) |
| *H03L 7/18* | (2006.01) |
| *H04B 1/12* | (2006.01) |
| *H03G 3/30* | (2006.01) |

(52) U.S. Cl.
CPC .................. *H04B 1/10* (2013.01); *H03J 7/00* (2013.01); *H03L 7/087* (2013.01); *H03L 7/099* (2013.01); *H03L 7/18* (2013.01); *H04B 1/123* (2013.01); *H04B 1/16* (2013.01); *H04B 17/318* (2015.01); *H03G 3/3052* (2013.01)

(58) Field of Classification Search
CPC .......... H04B 1/10; H04B 1/16; H04B 17/318; H04B 17/345; H03L 7/099; H03G 3/20
USPC ....................................................... 375/346
See application file for complete search history.

(56) References Cited

U.S. PATENT DOCUMENTS

2008/0317185 A1* 12/2008 Mueller ................. H03D 3/006
                                                                                             375/376
2014/0301339 A1* 10/2014 Sesia .................... H04B 1/0067
                                                                                              370/329

\* cited by examiner

*Primary Examiner* — Michael R Neff
(74) *Attorney, Agent, or Firm* — Michael A. Davis, Jr.; Charles A. Brill; Frank D. Cimino

(57) ABSTRACT

At least some embodiments are directed to a receiver system that comprises a first oscillation module configured to provide oscillating signals of differing frequencies and a second oscillation module configured to provide other oscillating signals of the differing frequencies. The second oscillation module is configured to produce less noise than the first oscillation module. A controller is coupled to the first and second oscillation modules and configured to selectively activate and deactivate each of the first and second oscillation modules based on signal strengths of primary signals received via a wireless medium and based on signal strengths of interference signals received via the wireless medium.

17 Claims, 5 Drawing Sheets

SELECTIVELY ACTIVATING OSCILLATION MODULES BASED ON SIGNAL STRENGTHS

CROSS-REFERENCE TO RELATED APPLICATIONS

The present application claims priority to Indian Provisional Patent Application No. 201641012995, which was filed on Apr. 13, 2016, is titled "Dynamic Mode Switching Radio," and is hereby incorporated herein by reference in its entirety.

BACKGROUND

Mobile communication systems typically operate in environments that contain many sources of interference signals. These interference signals are often dynamic, asynchronous, and vary in intensity. The interference signals may have different frequencies—for example, some interference signals may be 12.5 kHz above the frequency band within which the system operates, while other interference signals may be 25 kHz above the frequency band of interest, and yet other interference signals may be approximately 1 MHz above the frequency band of interest.

Receivers in mobile communication systems contain phase locked loops (PLLs) that produce noise. This noise frequently combines with the aforementioned interference signals to corrupt the signals in the frequency band of interest. This corruption may be mitigated by minimizing the noise produced by the PLLs. Controlling PLL noise, however, is a power-intensive endeavor.

SUMMARY

At least some embodiments are directed to a receiver system that comprises a first oscillation module configured to provide oscillating signals of differing frequencies and a second oscillation module configured to provide other oscillating signals of the differing frequencies. The second oscillation module is configured to produce less noise than the first oscillation module. A controller is coupled to the first and second oscillation modules and configured to selectively activate and deactivate each of the first and second oscillation modules based on signal strengths of primary signals received via a wireless medium and based on signal strengths of interference signals received via the wireless medium.

At least some embodiments are directed to a system comprising a receiver chain configured to produce a digitized output signal based on a received analog signal, and a received signal strength indication (RSSI) circuit configured to determine an RSSI based on the received analog signal. The system also includes a first oscillator configured to provide a first oscillating signal to a phase locked loop (PLL), and a second oscillator configured to provide a second oscillating signal to the PLL. The second oscillator is configured to consume more power than the first oscillator and to produce less noise than the first oscillator. The system further comprises a controller coupled to the receiver chain, the RSSI circuit, and the first and second oscillators, where the controller is configured to selectively activate and deactivate the first and second oscillators based on the RSSI and a strength of the digitized output signal.

At least some embodiments are directed to a method that comprises obtaining a plurality of signal strength values that characterize a wireless medium, determining characteristics of primary and interference signals in the wireless medium based on the plurality of signal strength values, and adjusting a synthesizer performance mode based on the determined characteristics. The synthesizer comprises at least one oscillator.

BRIEF DESCRIPTION OF THE DRAWINGS

For a detailed description of various examples, reference will now be made to the accompanying drawings in which.

DETAILED DESCRIPTION

At least some of the embodiments disclosed herein are directed to systems and methods for reducing power consumption in a mobile communication system by selectively transitioning between synthesizer (e.g., oscillator) performance modes depending on detected interference signal levels. Interference signal levels may be determined by manipulating multiple signal strength values. When the manipulated signal strength values indicate that interference signal levels are high, noise levels are likely to be high, and so jitter noise generated by the synthesizer in the receiver may be tightly (i.e., stringently) controlled by ensuring that the synthesizer is in a high performance, high power mode. Similarly, when the manipulated signal strength values indicate that interference signals levels are low, noise levels are likely to be low, and so jitter noise generated by the synthesizer in the receiver is controlled less tightly by ensuring that the synthesizer is in a low performance, low power mode. In this manner, high performance synthesizer modes are used only when synthesizer noise needs to be tightly controlled due to the presence of high-interference environments. As a result, power is conserved.

Figure 1:
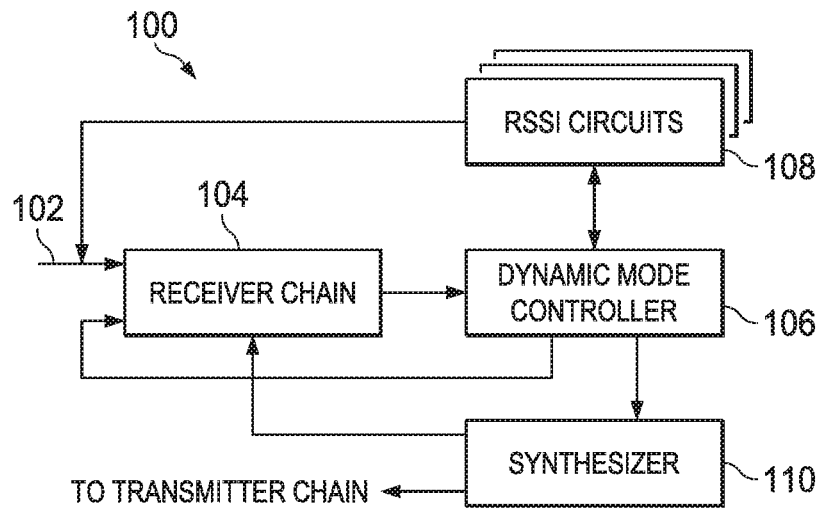
FIG. 1 is a block diagram of an illustrative wireless transceiver.

FIG. 1 is a block diagram of an illustrative wireless transceiver 100 that is configured to selectively switch between synthesizer performance modes based on interference signal levels, thus mitigating unnecessary power consumption. The wireless transceiver 100 may be implemented in any of a variety of applications, including and without limitation, mobile phones, tablets, laptop computers, desktop computers, medical devices, and oilfield products. In some embodiments, the wireless transceiver 100 is replaced by a receiver that is configured in a similar manner as the wireless transceiver 100 to reduce power consumption by selectively switching between synthesizer performance modes.

As depicted in FIG. 1, the wireless transceiver 100 may receive a radio frequency (RF) input signal 102 (e.g., from an antenna); a receiver chain 104 to process and digitize the RF input signal 102; a dynamic mode controller (DMC) 106—coupled to the receiver chain 104—to dynamically control a synthesizer performance mode; one or more received signal strength indication (RSSI) circuits 108 coupled to the DMC 106 and configured to detect signal strengths of the RF input signals 102; and a synthesizer 110, coupled to the DMC 106, that may comprise a phase locked loop (PLL) with one or more oscillators (e.g., voltage controlled oscillators, or VCOs) internal or external to the PLL. FIG. 1 is not necessarily an exhaustive depiction of all components of the wireless transceiver 100.

The RF input signals 102 comprise both primary signals (i.e., the desired signals containing data intended for the transceiver 100) and interference signals (i.e., the undesirable signals, known as "blockers," that interfere with the desired signals). In operation, the receiver chain 104 may receive and process the input signals 102 and provide processed, digital signals to the DMC 106. The receiver chain 104 may sufficiently filter the RF input signals 102 so that the digital signals output by the receiver chain 104 have minimal or no interference signal components and are purely or almost purely composed of primary signals. As a result, the DMC 106 readily determines the primary signal strength based on the output of the receiver chain 104. In addition, at least one of the RSSI circuits 108 may be configured to detect signal strengths (i.e., RSSI values) of the RF input signals 102 and to provide these RSSI values to the DMC 106. Because the RF input signals 102 comprise both primary and interference signals, the RSSI values that are provided to the DMC 106 will reflect signal strengths of the combined primary and interference signals. In some embodiments, the DMC 106 controls the RSSI circuits 108—for instance and without limitation, by issuing commands regarding when to detect signal strengths and for how long to detect signal strengths.

The DMC 106 may use the RSSI values to monitor the strengths of the RF input signals 102—that is, to monitor the strengths of the combined primary and interference signals. In addition, the DMC 106 may use the digitized output signals provided by the receiver chain 104 to monitor the strengths of the pure or nearly pure primary signals. For example, the DMC 106 may repeatedly obtain signal strength values over a specific length of time and/or continuously for a particular duration. In some embodiments, the DMC 106 records the signal strength values to a data structure within or external to the DMC 106. Such a data structure may cross-reference time stamps with signal strength values that were obtained at the corresponding times. In some embodiments, such data structures cross-reference time stamps with data obtained by manipulating signal strength values that were obtained at the corresponding times. Such manipulations may include, for instance, comparing signal strength values of primary signals to signal strength values (e.g., RSSI values) of RF input signals 102 to determine the signal strengths of the primary signals vis-à-vis the signal strengths of the interference signals. Other manipulations are contemplated and included within the scope of this disclosure, as are other formats and data populations for the aforementioned data structures.

The DMC 106 may determine whether to adjust a performance mode of the synthesizer 110 based on the signal strength values of the primary signals vis-à-vis the signal strength values of the interference signals. For example and without limitation, if the DMC 106 determines that the average primary signal strength for a particular period of time is generally greater than or equal to the average interference signal strength for the same period of time, the DMC 106 may ensure that the synthesizer 110 operates in a low performance mode in which noise is less stringently controlled. Conversely, if the DMC 106 determines that the average primary signal strength for a particular period of time is generally less than the average interference signal strength of the same period of time, the DMC 106 may ensure that the synthesizer 110 operates in a high performance mode in which noise is more tightly controlled. Variations are contemplated. For instance, the DMC 106 may adjust the synthesizer 110 mode only if the average primary signal strength exceeds the interference signal strength (or vice versa) by a predetermined threshold. In some embodiments, the DMC 106 may adjust the synthesizer 110 mode if a single primary signal strength value exceeds a single interference signal strength value (or vice versa). In this way, power is conserved during low interference signal strength situations.

The synthesizer 110 may house a PLL and multiple VCOs. In some embodiments, the synthesizer 110 includes a module of multiple VCOs that consume less power and thus may be referred to as "low performance VCOs," and another module of multiple VCOs that consume more power and thus may be referred to as "high performance VCOs." The low performance VCOs and high performance VCOs may operate within the same frequency band, but the high performance VCOs control noise to a greater degree than the low performance VCOs. A tradeoff, as mentioned, is that the high performance VCOs may consume more power than the low performance VCOs. In some embodiments, a single set of VCOs may be used, and the performance level of that single set of VCOs may be variably switched between a high performance/low noise state and a low performance/high noise state. The output of the synthesizer 110 may be provided as desired to the receiver chain 104 (e.g., for use in demodulation) and to a transmitter chain (e.g., for use in modulation).

Figure 2:
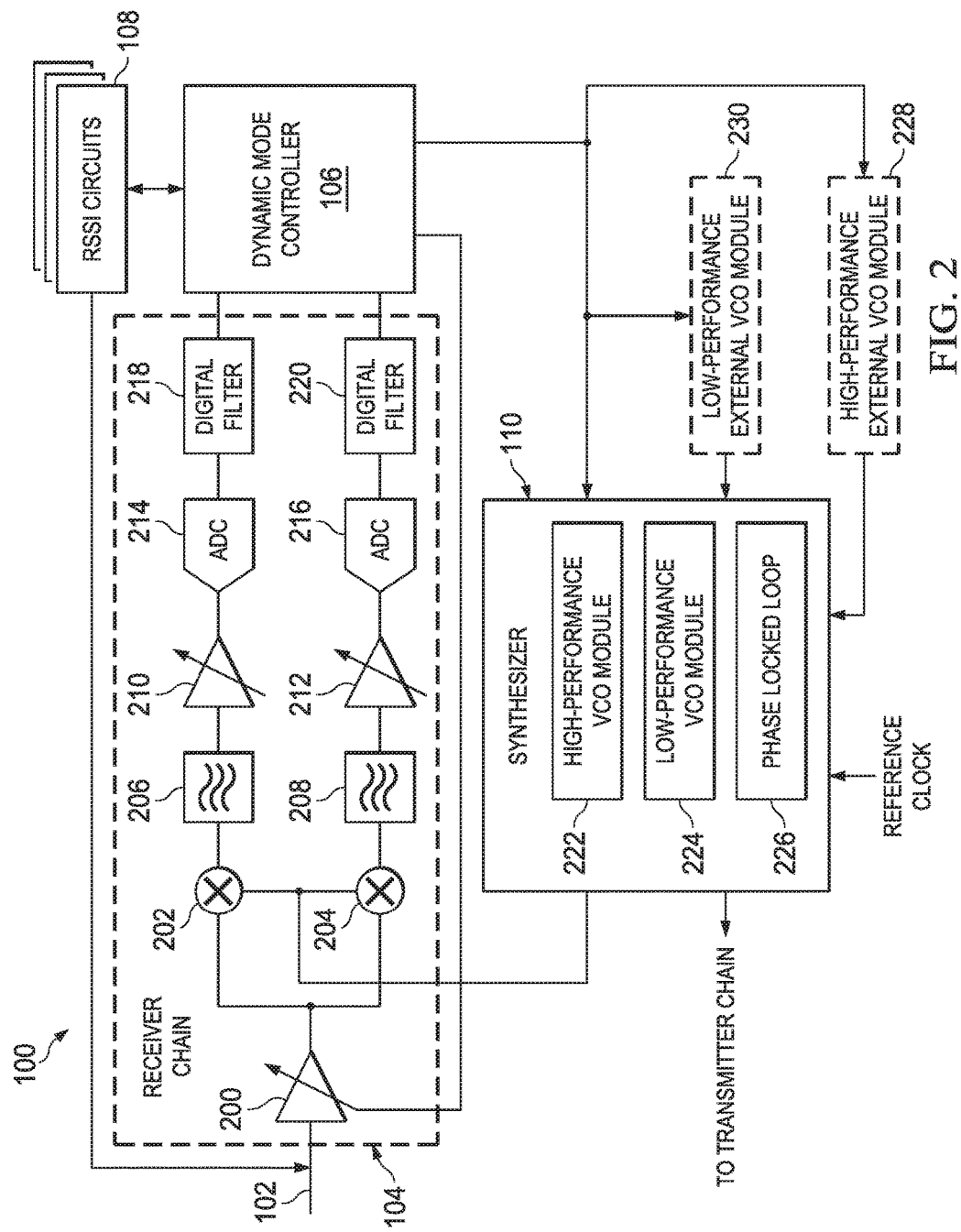
FIG. 2 is another block diagram of an illustrative wireless transceiver.

FIG. 2 is a detailed block diagram of an illustrative wireless transceiver 100. As shown, the illustrative, non-limiting receiver chain 104 includes a variable gain amplifier 200 (e.g., having a gain factor controlled by the DMC 106); mixers 202 and 204; filters 206 and 208; variable gain amplifiers 210 and 212; analog-to-digital converters (ADCs) 214 and 216 (e.g., sigma-delta ADCs); and digital filters 218 and 220. Although the illustrative receiver chain 104 comprises dual paths, each of the paths may operate similarly. The mixer 202, for example, mixes the received, amplified analog signal with the oscillating signal from the synthesizer 110. The filter 206, which may be any suitable type of filter (e.g., high-pass, low-pass), filters the mixed signal, and the amplifier 210 amplifies the filtered signal by a gain factor (e.g., optionally controlled by the DMC 106). The ADC 214 digitizes the amplified signal, and the digital filter 218 filters the digital signal to produce a digital output signal that is provided to the DMC 106.

In addition, FIG. 2 depicts at least some of the contents of an illustrative synthesizer 110, including a high-performance VCO module 222, a low-performance VCO module 224, and a PLL 226. Each VCO module may contain an array of VCOs that collectively span the desired frequency range. The high-performance VCO module 222 may operate using a high level of power but may control noise stringently. Conversely, the low-performance VCO module 224 may operate using a low level of power but may control noise less stringently. Although only two VCO modules are depicted in the synthesizer 110, in some embodiments, multiple high-performance VCO modules 222 and multiple low-performance VCO modules 224 may be implemented. Furthermore, in some embodiments, a high-performance external VCO module 228 and a low-performance external VCO module 230 may be used. These VCO modules 228 and 230 may be external to the synthesizer 110. Further still, in some embodiments, high-performance and low-performance VCO modules may be implemented within the PLL 226. In some embodiments, a combination of the foregoing VCO modules may be used. In yet other embodiments, a single VCO module with variable performance modes may be used. All such variations are included within the scope of this disclosure.

Figure 3:
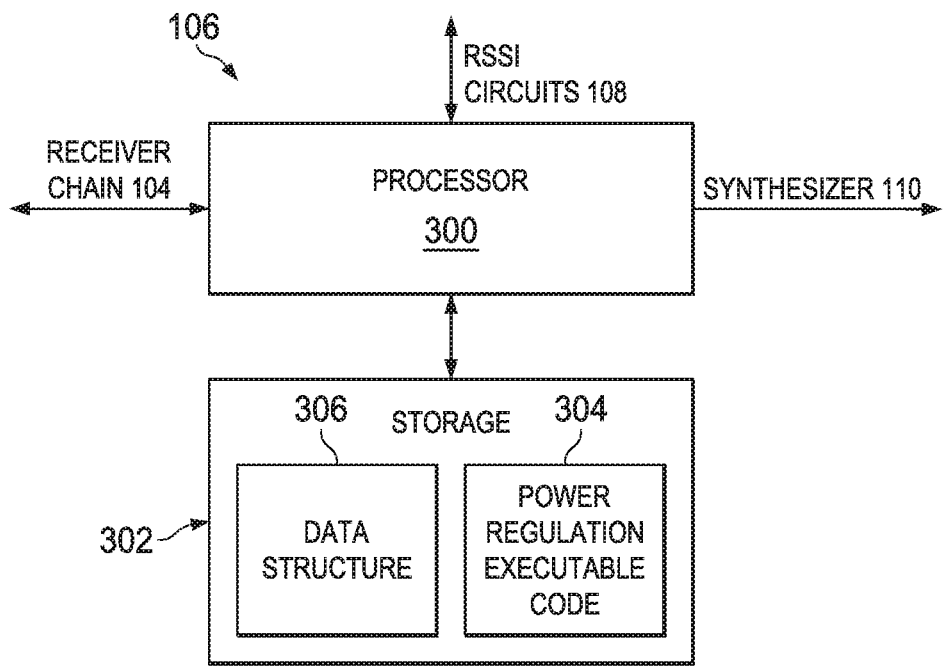
FIG. 3 is a block diagram of an illustrative dynamic mode controller.

FIG. 3 is a block diagram of an illustrative DMC 106. The DMC 106 may include a processor 300 that couples to storage 302 (e.g., random access memory, read-only memory). The storage 302 may store software programs, such as power regulation executable code 304. Additionally, the storage 302 may store other types of items, such as data structures 306. The executable code 304, when executed by the processor 300, causes the processor 300 to perform some or all of the functions attributed herein to the DMC 106 and/or to the processor 300. The processor 300 may populate the data structures 306 with any suitable type of information, such as—and without limitation—signal strength values, manipulated signal strength values (e.g., results of comparisons between RSSI values of the RF input signals 102 and the digital signals that are output by the receiver chain 104 in FIG. 1), and time stamps that correspond to the time(s) at which the signal strength values were recorded to the data structure(s) 306.

Figure 4:
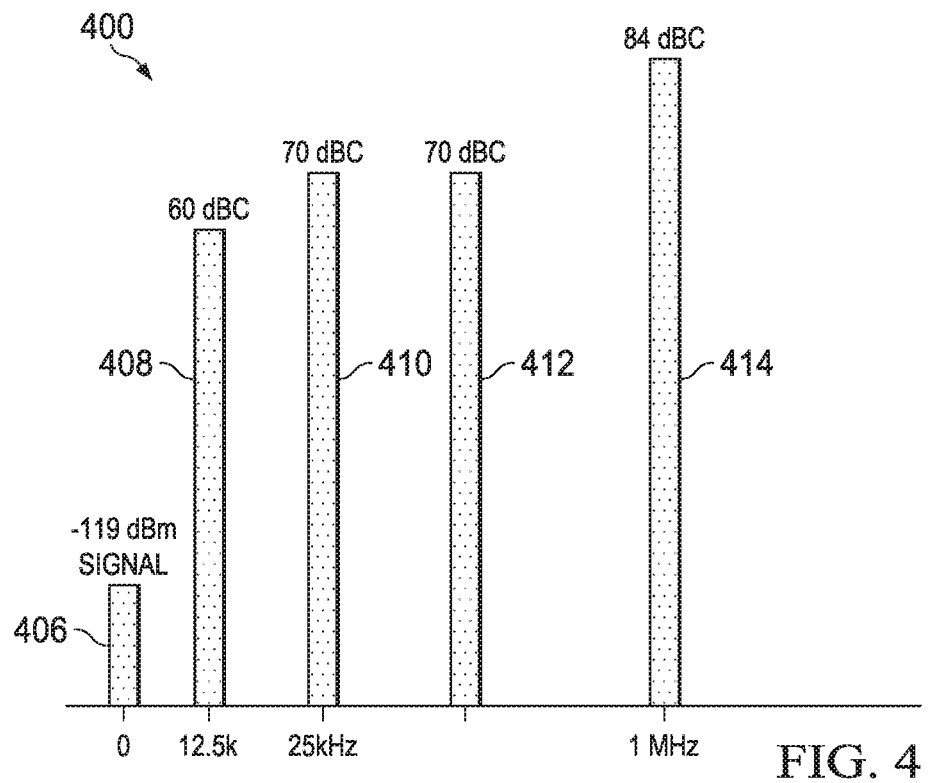
FIG. 4 is a graph depicting illustrative primary and interference signals as a function of frequency.

FIG. 4 is a graph 400 depicting—as a function of frequency—the strengths of illustrative primary and interference signals that may be received by the illustrative transceiver 100. Specifically, the graph 400 includes a primary signal 406 and interference signals 408, 410, 412, and 414. The primary signal 406 may have a frequency of approximately f kHz, the interference signal 408 may have a frequency that is offset from f by approximately 12.5 kHz, and the interference signals 410, 412, and 414 may have frequencies that are offset from f by approximately 25 kHz, 100 kHz, and 1 MHz, respectively. These frequencies are merely illustrative and do not limit the scope of this disclosure. Primary and interference signals may correspond to any of a variety of different frequencies. In this example, the primary signal 406 may have a strength of approximately −119 dBm, and the interference signals 408, 410, 412, and 414 may have strengths of approximately 60 dBc, 70 dBc, 70 dBc, and 84 dBc, respectively. As with the frequencies of the signals, the signal strengths are illustrative and non-limiting. In this example, the primary signal 406 has a lower signal strength than the signal strengths of the interference signals 408, 410, 412, and 414. The DMC 106 may identify this difference in signal strengths by comparing the signal strength of the digital output of the receiver chain 104—which corresponds to the primary signal 406—to the signal strength (e.g., RSSI value) of the RF input signal 102, which corresponds to all of the signals 406, 408, 410, 412, and 414. This comparison may be performed using any of a variety of known algorithms. Based on the comparison, the DMC 106 may determine that the signal strength of the primary signal 406 is less than the collective signal strength of the interference signals 408, 410, 412, and 414 (e.g., by a predetermined threshold that is programmed into the DMC 106 or otherwise provided to the DMC 106), and, as a result, the DMC 106 may ensure that the synthesizer 110 is in a high performance, low noise mode. As previously mentioned, the DMC 106 may perform such comparisons based on single signal strength values or averages of multiple values over a period of time (e.g., such as the signal strength values recorded in the data structure 306, FIG. 3). Other statistical analyses may be performed besides mean computations; for instance, the DMC 106 may determine median signal strength values over a period of time. All such variations are included in the scope of the disclosure.

If, based on any or all of the foregoing analyses, the DMC 106 determines that the signal strength values indicate strong interference signals and comparably weak primary signals, tight synthesizer noise control may be desirable. Accordingly, the DMC 106 may ensure that the synthesizer 110 is in a high performance mode—for instance, by activating a high-performance VCO module 222 (FIG. 2) if a high-performance VCO module is not already activated, and by deactivating a low-performance VCO module 224 if a low-performance VCO module is active. Alternatively, if a single VCO module is used, the DMC 106 may ensure that that VCO module is in a high performance mode. Conversely, if the DMC 106 determines that the signal strength values indicate weak interference signals and relatively strong primary signals, tight synthesizer noise control may not be necessary and may result in unnecessary power consumption. Accordingly, the DMC 106 may ensure that the synthesizer 110 is in a low performance mode—for example, by activating a low-performance VCO module 224 (FIG. 2) if a low-performance VCO module is not already activated, and by deactivating a high-performance VCO module 222 if a high-performance VCO module is active. In embodiments with a single VCO module, the DMC 106 may ensure that the VCO module is in a low performance mode.

The manner in which the DMC 106 switches the synthesizer 110 performance mode depends on the available VCO module configuration. In a multi-VCO module system, the DMC 106 may provide an enable signal to each VCO module that causes that particular VCO module to be on or off. Thus, for example, the enable signal provided to a high performance VCO module may turn that module on, while the enable signal provided to a low performance VCO module may turn that module off. In at least some embodiments, high performance and low performance VCO modules will not be simultaneously on. In a single VCO module system, the DMC 106 may provide a mode signal to the VCO module that dictates whether the VCO module is in a high performance or low performance mode.

In at least some embodiments, the DMC 106 switches synthesizer performance modes at specific times to avoid the loss of transmitted data or other problems. In some such embodiments, the DMC 106 switches synthesizer performance modes during the guard times in between bursts of data. Thus, for example, if the DMC 106 determines that the synthesizer 110 should switch performance modes based on the interference signal strength information available, the DMC 106 may determine whether a data burst is currently being received or whether the transceiver is currently in a guard time interval (using, e.g., data from the receiver chain 104). If a data burst is currently being received, the DMC 106 may delay switching the performance mode until a guard time interval is available. If the DMC 106 determines that a guard time interval is currently available, it may proceed with the synthesizer 110 performance mode switch.

Figure 5B:
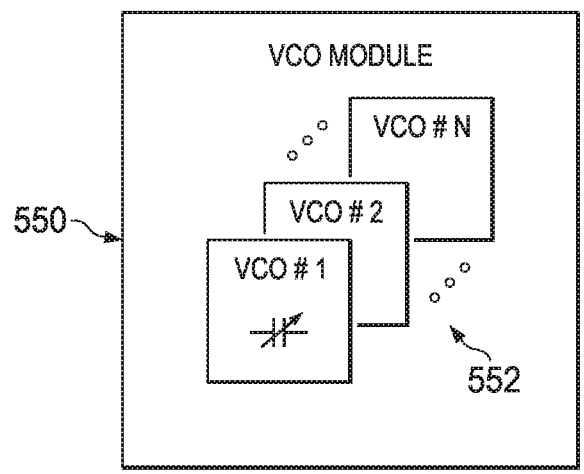
FIG. 5B is a block diagram of an illustrative voltage-controlled oscillator (VCO) module.
Figure 5A:
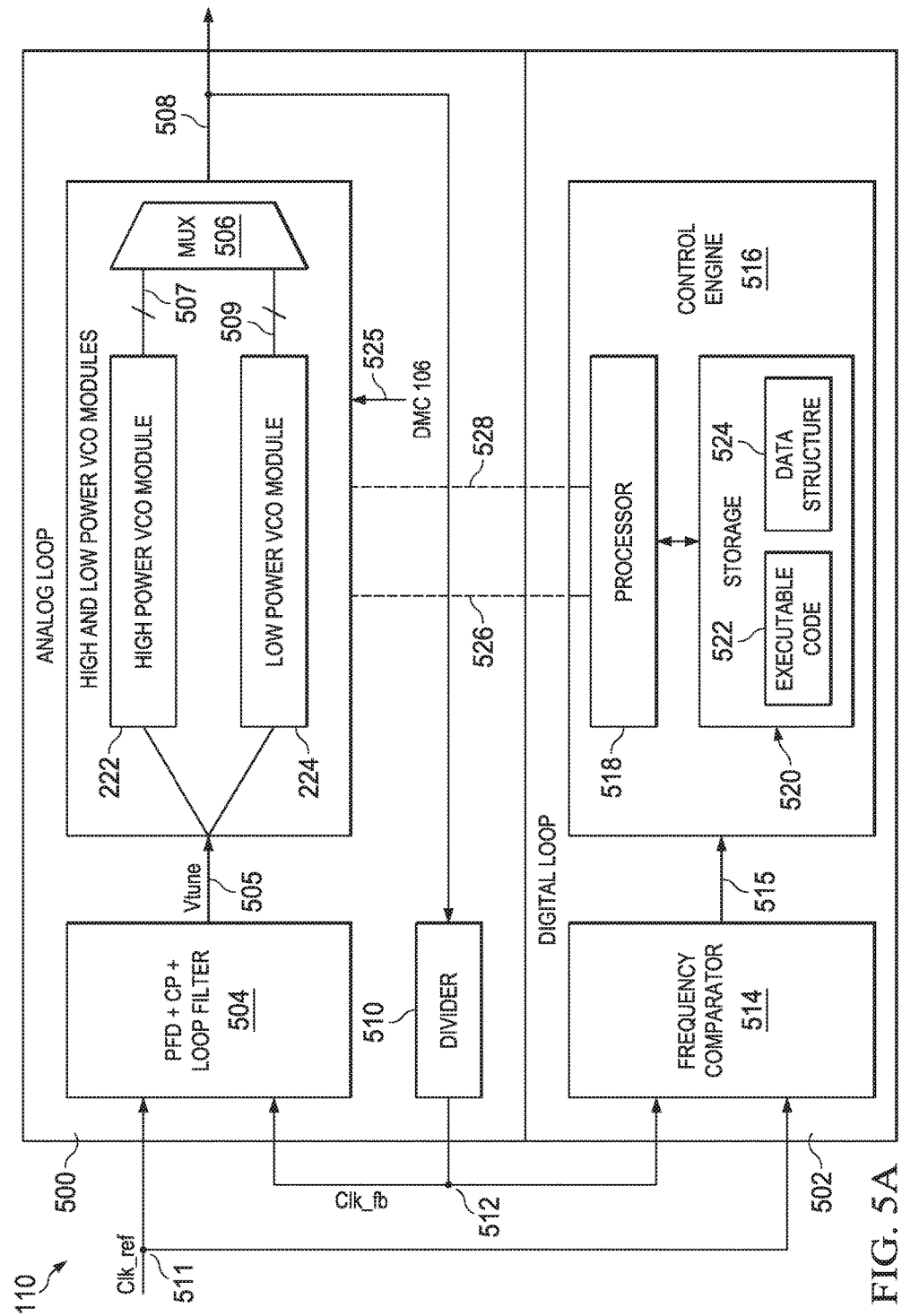
FIG. 5A is a block diagram of an illustrative synthesizer.

Because the guard time interval may be short (e.g., 2.5 milliseconds), the synthesizer may be configured so that it locks frequencies and phases quickly—that is, before the current guard time interval expires. FIG. 5A is a block diagram of an illustrative embodiment of synthesizer 110 that is configured to lock frequencies and phases quickly to accommodate short guard time intervals. The synthesizer 110 may receive a reference clock signal Clk_ref 511 and may comprise an analog loop portion 500 and a digital loop portion 502. The analog loop portion 500 may include various portions of a PLL, such as a phase-frequency detector (PFD), a charge pump (CP), and a loop filter. Collectively, these PLL components are indicated by numeral 504. The PLL components 504 output an analog tuning signal Vtune 505 to the high performance VCO module 222 and the low performance VCO module 224. Each of the VCO modules 222 and 224 contains an array (or "bank") of VCOs. As previously explained, any suitable configuration of VCOs may be used. For instance, in some embodiments, three or more VCOs modules may be used, including a medium performance VCO module that has a power consumption level between those of the high and low performance VCO modules. In some embodiments, a single VCO module with multiple performance modes may be used. Each VCO in each VCO module may include an array of capacitors as well as a varactor for fine frequency tuning purposes. The enable signal 525 from the DMC 106 is provided to each of the VCO modules 222 and 224, with the enable signal 525 being inverted for one of the VCO modules. In this way, the DMC 106 turns one module on while the other module is off. In other embodiments, two separate enable signals may be provided, with each enable signal going to a different one of the VCO modules. In some embodiments with three or module VCO modules, a matching number of enable signals may be provided. In embodiments with a single VCO module, a single enable signal may be provided.

The synthesizer 110 may further include a multiplexer (mux) 506 that receives the outputs of the VCO modules 222 and 224 and outputs a single signal 508 based on the enable signal 525 received from the DMC 106. The signal 508 may be provided to circuitry in the receiver and/or transmitter chains as may be appropriate and as illustratively depicted in FIG. 1. The signal 508 may also be provided to a divider 510, the output 512 of which may be fed back to the PLL components 504 as Clk_fb.

The digital loop portion 502 may include a frequency comparator 514 and a control engine 516. The control engine 516 may comprise a processor 518, storage 520 (e.g., ROM or RAM), and both executable code 522 and a data structure 524 stored on the storage 520. The executable code 522, when executed by the processor 518, may cause the processor 518 to perform some or all of the functions attributed herein to the processor 518. In performing its functions, the processor 518 may record data by populating the data structure 524. The frequency comparator 514 receives the Clk_ref 511 and Clk_fb 512 signals and provides a correction signal 515 to the control engine 516. The control engine 516, in turn, provides digital output codes 526 and 528 to the VCO modules 222 and 224 to select a particular VCO and to select a particular configuration of capacitors within the selected VCO.

In operation, the frequency comparator 514 in the digital loop 502 receives the reference clock signal Clk_ref 511 and the feedback clock signal Clk_fb 512 and compares the frequencies of the two clock signals to produce the correction signal 515. The control engine 516 receives and uses the correction signal 515 to increase or decrease the digital output codes 526 and 528. The digital output code 528 may be provided to both the high and low performance VCO modules 222 and 224 and is used to select a particular VCO in each of the VCO modules 222 and 224. (The frequency output by the selected pair of VCOs is the same, but the noise (and, thus, power consumption) associated with the VCOs is different.)) The digital output code 526 represents a capacitor code, or "cap code," that is used to select a particular capacitor configuration within each VCO specified by the digital output code 528. Thus, for example, for a given digital output code 528 specifying a particular VCO, the digital output code 526 may be varied through numerous values to effectuate a variety of different capacitor configurations, with each VCO and each capacitor configuration within that VCO producing a different frequency output at the signal 508. FIG. 5B depicts an illustrative VCO module 550, which may represent either or both of the VCO modules 222 and 224. The illustrative VCO module 550 may comprise an array of VCOs 552, with each VCO containing an array of capacitors (not expressly depicted) and one or more varactors for analog tuning purposes.

Referring again to FIG. 5A, as the digital output code 528 changes, different VCOs are selected, and so different frequencies are output on signal 508. This alters the signal Clk_fb 512, which again alters the digital output code 528. This process causes the digital output code 528 to converge on a particular VCO in VCO module 222 or 224 (whichever is on based on the enable signal 525) that outputs a frequency that most closely approximates the reference signal Clk_ref 511. Once the digital output code 528 has stabilized, the control engine 516 begins to vary the digital output code 526, with each digital output code 526 representing a different cap code that causes a different configuration of capacitors to be effectuated in the selected VCO. The digital output code 526 is varied based on the correction signal 515 until the digital output code 526 converges on a capacitor configuration that most closely approximates the reference signal Clk_ref 511. Once the most accurate digital output code 526 is identified, the control engine 516 may populate the data structure 524 with the digital output codes 526 and 528 and a corresponding reference frequency Clk_ref 511. In such embodiments, Clk_ref 511 may be provided to both the frequency comparator 514 as well as the control engine 516. The analog loop 500 then further converges on Clk_ref 511 by tuning a varactor in the selected VCO using the analog tuning signal 505. Feedback is provided via signals 508 and 512 until Clk_ref 511 and Clk_fb 512 match. The result of the foregoing digital and analog frequency matching process is that a signal 507 or 509 is generated by the VCO module 222 or 224, respectively, depending on the state of the enable signal 525. The multiplexer 506, which is controlled by the enable signal 525, permits the output signal of the enabled VCO module to pass.

In this manner, the analog and digital loops 500 and 502 work in concert to produce a matching Clk_ref 511 and Clk_fb 512. If the Clk_ref 511 is altered, the loops 500 and 502 may adjust accordingly using the feedback loops, digital codes, and analog tuning signal as described above to cause the Clk_ref 511 and Clk_fb 512 to match again. In some embodiments, the control engine 516 compares each new Clk_ref 511 value with the data structure 524 to determine whether an entry exists for that Clk_ref 511 value. If such an entry exists, the control engine 516 may implement the digital output codes 526 and 528 that are cross-referenced with the Clk_ref 511 in that entry without cycling through the various possible digital output code values in an attempt to converge on the most accurate set of values. In this way, the control engine 516 reduces the amount of time required to converge upon the proper digital output codes 526 and 528.

Figure 6:
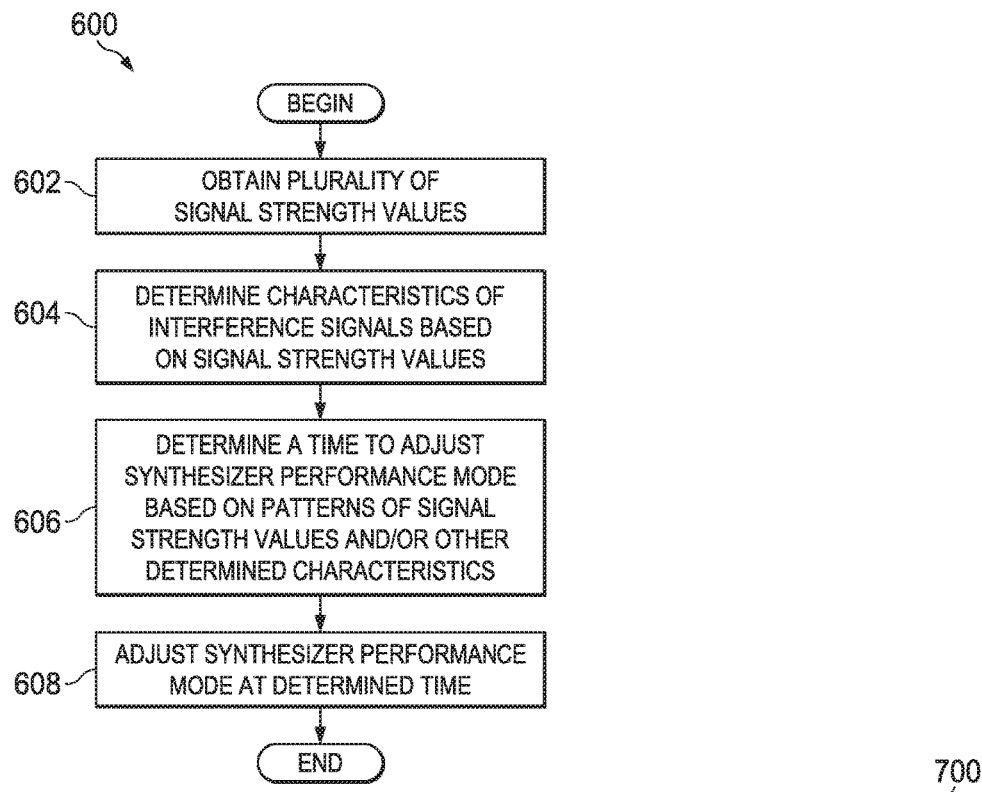
FIG. 6 is a flow diagram of an illustrative method for reducing power consumption by selectively transitioning between synthesizer performance modes.

FIG. 6 is a flow diagram of an illustrative method 600 for reducing power consumption by selectively transitioning between synthesizer performance modes. The method 600 may begin with obtaining a plurality of signal strength values (step 602), such as from the RSSI circuits 108 depicted in FIGS. 1 and 2 and by using the primary, digital signal output of the receiver chain 104 in FIGS. 1 and 2, as described above. This step may be performed by, e.g., the DMC 106. The method 600 may subsequently comprise determining characteristics of interference signals based on the signal strength values (step 604). For example, the DMC 106 may compare signal strength values as described above and as described below with respect to FIG. 7 to determine the strengths of primary and interference signals.

Assuming that interference signals in the relevant wireless medium are such that the synthesizer performance mode should be adjusted, the method 600 may next include determining a time to adjust synthesizer performance mode based on patterns of signal strength values and/or other determined characteristics (step 606). For instance, the DMC 106 may record signal strength values along with relevant time stamps in a data structure 306 (FIG. 3), and the DMC 106 may use the recorded values to determine interference signal patterns to determine the approximate time(s) at which the synthesizer performance mode should be switched. If, for example, the signal strength value patterns indicate that the interference signal strengths are periodic in nature, the DMC 106 may switch the synthesizer from a low performance mode to a high performance mode in a guard interval that immediately precedes the anticipated swing from lower interference signal strength to higher interference signal strength. The method 600 may also comprise adjusting the synthesizer performance mode at the determined time (step 608). The steps of the method 600 may be adjusted as desired, including by adding, deleting, modifying, or rearranging one or more steps.

Figure 7:
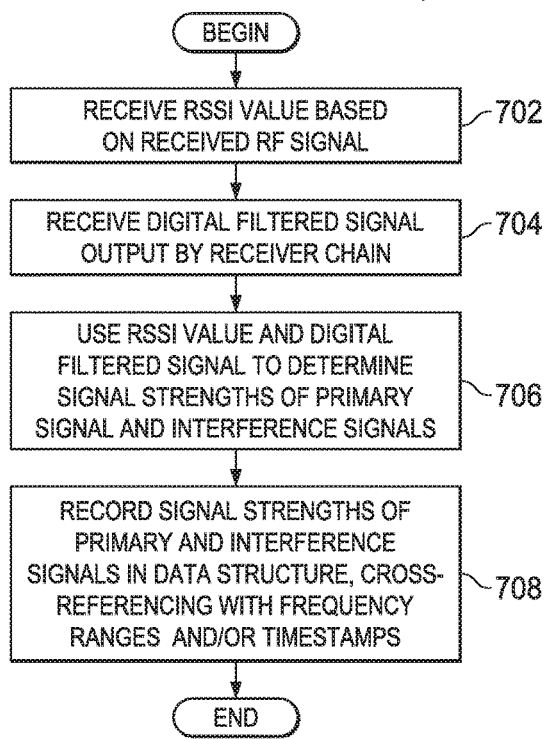
FIG. 7 is a flow diagram of an illustrative method for manipulating received signal strength indication data.

FIG. 7 is a flow diagram of an illustrative method 700 for manipulating signal strength data. Specifically, the method 700 may begin with receiving an RSSI value based on a received RF signal (e.g., RF output signal 102 in FIGS. 1 and 2) (step 702). The method 700 next includes receiving a digital, filtered signal output by a receiver chain (e.g., receiver chain 104 in FIGS. 1 and 2) (step 704). The method 700 next comprises using the RSSI value, which represents signal strength of the combined primary and interference signals, and the signal strength of the receiver chain output, which represents the strength of only the primary signal, to determine the signal strengths of the primary and interference signals (step 706). When recording the results of these signal strength manipulations in a data structure (e.g., data structure 306 in FIG. 3), the DMC 106 may match the results with corresponding frequency ranges and/or time stamps (step 708). The steps of the method 700 may be adjusted as desired, including by adding, deleting, modifying, or rearranging one or more steps.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A receiver system, comprising:
    a first oscillation module having a first activation input, a first selection input, first oscillators and first outputs, the first oscillators configured to provide first oscillating signals of differing frequencies at the first outputs;
    a second oscillation module having a second activation input, a second selection input, second oscillators and second outputs, the second oscillators configured to provide second oscillating signals of the differing frequencies at the second outputs, the second oscillating signals having less noise than the first oscillating signals;
    a controller having a controller input and a controller output, the controller output coupled to the first and second activation inputs, and the controller configured to activate or deactivate the first oscillation module and activate or deactivate the second oscillation module, by operating the controller output based on indications at the controller input of primary and interference signal strengths; and
    a control engine having control engine outputs coupled to the first and second selection inputs, the control engine storing correlations between output frequencies and the first and second oscillators, the control engine configured to select one of the first oscillators if the first oscillation module is activated by the controller, select one of the second oscillators if the second oscillation module is activated by the controller, and select a capacitor configuration in the selected oscillator to provide an oscillating signal at a particular output frequency, by operating the control engine outputs responsive to the correlations.

2. The receiver system of claim 1, wherein the controller is configured to activate or deactivate the first oscillation module, and activate or deactivate the second oscillation module, at a time that is determined based at least in part on patterns of the indications.

3. The receiver system of claim 1, wherein the controller is configured to activate or deactivate the first oscillation module, and activate or deactivate the second oscillation module, based on a first mathematical manipulation of the indications and based on a second mathematical manipulation of the indications.

4. The receiver system of claim 1, wherein the controller is configured to activate one of the first and second oscillation modules while deactivating the other of the first and second oscillation modules.

5. A system, comprising:
    a receiver chain configured to produce a digitized output signal based on a received analog signal;
    a received signal strength indication (RSSI) circuit configured to determine an RSSI based on the received analog signal;
    a first oscillator configured to provide a first oscillating signal to a phase locked loop (PLL);
    a second oscillator configured to provide a second oscillating signal to the PLL, the second oscillator having a higher power consumption than the first oscillator, and the second oscillating signal having less noise than the first oscillating signal; and
    a controller coupled to the receiver chain, the RSSI circuit, and the first and second oscillators, the controller configured to: activate or deactivate the first oscillator, and activate or deactivate the second oscillator, based on the determined RSSI and a strength of the digitized output signal; and record samples of the determined RSSI and samples of the strength of the digitized output signal.

6. The system of claim 5, wherein the controller is configured to determine a strength of interference signals in the received analog signal, based on the determined RSSI and the strength of the digitized output signal.

7. The system of claim 6, wherein the controller is configured to activate the second oscillator when the strength of the interference signals exceeds the strength of the digitized output signal by a threshold amount.

8. The system of claim 5, wherein the controller is configured to produce a first average of the samples of the determined RSSI and to produce a second average of the samples of the strength of the digitized output signal and to activate or deactivate the first oscillator, and activate or deactivate the second oscillator, based on the first and second averages.

9. The system of claim 5, wherein the controller is configured to determine timing at which to activate or deactivate the first oscillator, and activate or deactivate the second oscillator, based on the samples of the determined RSSI and the samples of the strength of the digitized output signal.

10. The system of claim 5, wherein the controller is configured to use a median of the samples of the determined RSSI and a median of the samples of the strength of the digitized output signal to activate or deactivate the first oscillator, and activate or deactivate the second oscillator.

11. A method, comprising:
obtaining signal strength values that characterize a wireless medium;
determining characteristics of primary and interference signals in the wireless medium based on the signal strength values;
adjusting a synthesizer performance mode based on the determined characteristics, the synthesizer comprising at least one oscillator; and
determining a time to adjust the synthesizer performance mode based on a time log of the determined characteristics.

12. The method of claim 11, wherein at least one of the signal strength values comprises a received signal strength indicator (RSSI) value.

13. The method of claim 11, further comprising identifying an interference signal pattern based on the time log.

14. The method of claim 11, wherein adjusting the synthesizer performance mode comprises activating a first oscillator module and deactivating a second oscillator module, the second oscillator module having a lower noise than the first oscillator module.

15. A method, comprising:
obtaining signal strength values that characterize a wireless medium;
determining characteristics of primary and interference signals in the wireless medium based on the signal strength values, wherein determining the characteristics comprises comparing strengths of the primary signals to strengths of composite signals comprising both the primary and interference signals; and
adjusting a synthesizer performance mode based on the determined characteristics, the synthesizer comprising at least one oscillator.

16. A method comprising:
obtaining signal strength values that characterize a wireless medium;
determining characteristics of primary and interference signals in the wireless medium based on the signal strength values;
adjusting a synthesizer performance mode based on the determined characteristics, the synthesizer comprising at least one oscillator;
selecting a voltage-controlled oscillator (VCO) from among a group of voltage-controlled oscillators using a first digital output code generated using a reference clock signal and a feedback clock signal;
selecting a capacitor configuration in the VCO using a second digital output code generated based on the reference clock signal and the feedback clock signal;
tuning a varactor of the VCO based on the reference clock signal and the feedback clock signal; and
recording the first and second digital output codes in a data structure.

17. The method of claim 16, further comprising using the data structure to select the VCO a second time and to select the capacitor configuration in the VCO a second time.

* * * * *